United States Patent
Blinov et al.

[11] Patent Number: 5,595,793
[45] Date of Patent: Jan. 21, 1997

[54] SURFACE-PLASMA-WAVE COATING TECHNIQUE FOR DIELECTRIC FILAMENTS

[75] Inventors: Leonid Blinov, Moscow, Russian Federation; Wolfgang Neuberger, Monchengladbach, Germany

[73] Assignee: Ceram Optec Industries, Inc., East Longmeadow, Mass.

[21] Appl. No.: 428,770

[22] Filed: Apr. 24, 1995

[51] Int. Cl.$^6$ ........................................... B05D 1/04
[52] U.S. Cl. ................... 427/575; 118/723 MW; 427/163.2; 427/255.5; 427/585
[58] Field of Search ..................... 427/575, 585, 427/163.2, 255.5; 118/723 MW

[56] References Cited

U.S. PATENT DOCUMENTS 5,000,541  3/1991  DiMarcello et al. ............... 350/96.3
5,178,743  1/1993  Kumar ............................. 204/298.21

Primary Examiner—Bernard Pianalto
Attorney, Agent, or Firm—Bolesh J. Skutnik

[57] ABSTRACT

A method and device is described to generate plasmas on the surface of dielectric filaments and—by a plasma chemical vapor deposition (CVD) mechanism—deposit dielectric films on the filaments as they move through the plasma zone. The plasma generated by plasma surface waves are located only in the vicinity of the filament thus reducing precursor gas consumption, deposition on chamber walls, power requirements. The method is particular suitable for manufacturing dielectric coated optical fibers.

5 Claims, 2 Drawing Sheets

SURFACE-PLASMA-WAVE COATING TECHNIQUE FOR DIELECTRIC FILAMENTS

BACKGROUND OF THE INVENTION

1. Field of the Invention

The invention relates to a method of coating the dielectric filaments with dielectric coatings based on plasma chemical vapor deposition (CVD) mechanism. The method is especially useful for coating optical fibers. The device for realization of the proposed method is also described.

2. Information Disclosure Statement

Numerous methods and devices have been proposed to coat optical fibers with dielectric hermetic coatings by plasma chemical vapor deposition. Plasma CVD methods in general show certain advantages over conventional chemical CVD methods. For instance, it is possible to obtain diamondlike carbon layers or diamond layers on substrates only with plasma CVD with high deposition rates and at reasonable pressures. Such layers are, for instance, desired as a hermetic, abrasion resistant protection for optical quartz glass fibers. Such diamondlike coatings are substantially harder—and therefore more durable than the graphitic layers being deposited by conventional CVD as described, for instance, in U.S. Pat. No. 5,000,541. U.S. Pat. No. 5,178,743 describes a cylindrical magnetron sputtering system. While this system may be well applicable to deposit various films on filaments, the magnetic confinement mechanism used therein can only be effective at very low pressures (several milliTorr to maximum 100 milliTorr). This creates sealing problems at the filament inlet and outlet to the deposition chamber. Furthermore the deposition length of such a device is practically very limited. Other potential methods include long electrodes being placed around the moving filament to generate a HF plasma or a microwave resonator around a tubular deposition chamber, generating a cylindrical plasma zone, through which the fiber is passing.

In all these cases the plasma volume is considerably larger than the volume occupied by the filament to be coated. While this is a general problem encountered with the coating of any filaments by plasma. CVD, the geometry of optical fibers (diameters typically 125 μm to 1 mm) is particularly mismatched with the large plasma volumes generated in order to coat their small surfaces. This results in a majority of the deposition taking place not on the filament—as desired—but on the electrodes, the chamber walls and other secondary surfaces. This deposition can crack during the coating runs, create dust and thus result in film deficiencies on the filament itself. The plasma distribution can be non-uniform, high gas consumption and large amounts of residual gas are further consequences of the unnecessarily large plasma volumes. Thus, it would be desirable to generate the plasma only in the close vicinity of the filament, where it contributes to the deposition process.

OBJECTS AND SUMMARY OF THE INVENTION

The present invention intends to overcome all of the above stated defects of the present state of the art by generating plasma only next to the surface of the filament.

It was discovered that a plasma can be generated on the surface of a dielectric filament by feeding microwave energy into a splitter that separates it into two linear polarized components, phase shifting one of them recombining them and thus obtaining a rapidly rotating circular wave. This wave being coupled to the surface of the fiber by a conical launch device generates a surface wave of $HE_{11}$- type guided by the fiber surface, thus creating a plasma around the fiber. The microwave input frequency needs to exceed some critical level determined by the fiber geometry. The energy of microwave radiation determines the length of the plasma zone.

As the field intensity of the hybrid azimuthal surface wave drops drastically with the distance from the fiber, the plasma only exists in the close vicinity of the filament, thereby eliminating deposition on the chamber walls and excessive gas use or particle (dust) formation.

Briefly stated, the present invention provides a method and a system to generate plasmas on the surface of dielectric filaments and—by a plasma chemical vapor deposition (CVD) mechanism—deposit dielectric films on the filaments as they move through the plasma zone. The plasma generated by plasma surface waves are located only in the vicinity of the filament thus reducing precursor gas consumption, deposition on chamber walls and power requirements. The method is particular suitable for manufacturing dielectric coated optical fibers.

The above, and other objects, features and advantages of the present invitation will become apparent from the following description read in conjunction with the accompanying drawings, in which like reference numbers in different drawings denote like items.

DESCRIPTION OF PREFERRED EMBODIMENTS

Under suitable circumstances the dielectric filament to be coated can indeed serve as the object on which surface plasma waves can be generated. While it is difficult to generate surface plasma waves on small diameter filaments, it was found that the azimuthal hybrid $HE_{11}$ wave was able to generate long homogeneous plasma region around dielectric filaments, provided certain restrictions for the microwave frequency are fulfilled.

Frequencies of the microwave used to excite the surface plasma waves are typically between 7 to 300 GHz. The azimuthal hybrid $HE_{11}$ wave guided by the filament surface and exponentially decreasing with the distance from the surface has no cut off frequency. Therefore, trader certain conditions only this single mode can be generated while the higher order modes are not guided by the filament.

The dielectric filament is able to guide one single hybrid $HE_{11}$ wave generating plasma at the vicinity of the filament surface when wavelength of the microwave radiation λ is smaller than some critical value:

$$\lambda_{crit}=1.3d(\epsilon_1-\epsilon_2)^{1/2}.$$

In this equation d is the diameter of the filament to be coated (typically between 0.1 and 5 mm), $\epsilon_1$ is the dielectric constant of the waveguiding filament and $\epsilon_2$ is the dielectric constant of the plasma. Since the dielectric constant of the plasma $\epsilon_2$ is negative, the well confined surface plasma waves can propagate along the surface separating a dielectric material of the filament and plasma.

The length of the region along the filament where plasma is generated increases with the power of microwave. The length is however limited by the attenuation accruing along the filament length. It seems however that the attenuation decreases with $f^{1/2}$, whereby $f$ is the microwave frequency used. This means that higher frequencies (typically used to coat thinner fibers) allow longer plasma regions (longer in multiples of the fiber diameter). This is very useful for practical purposes.

Figure 1:
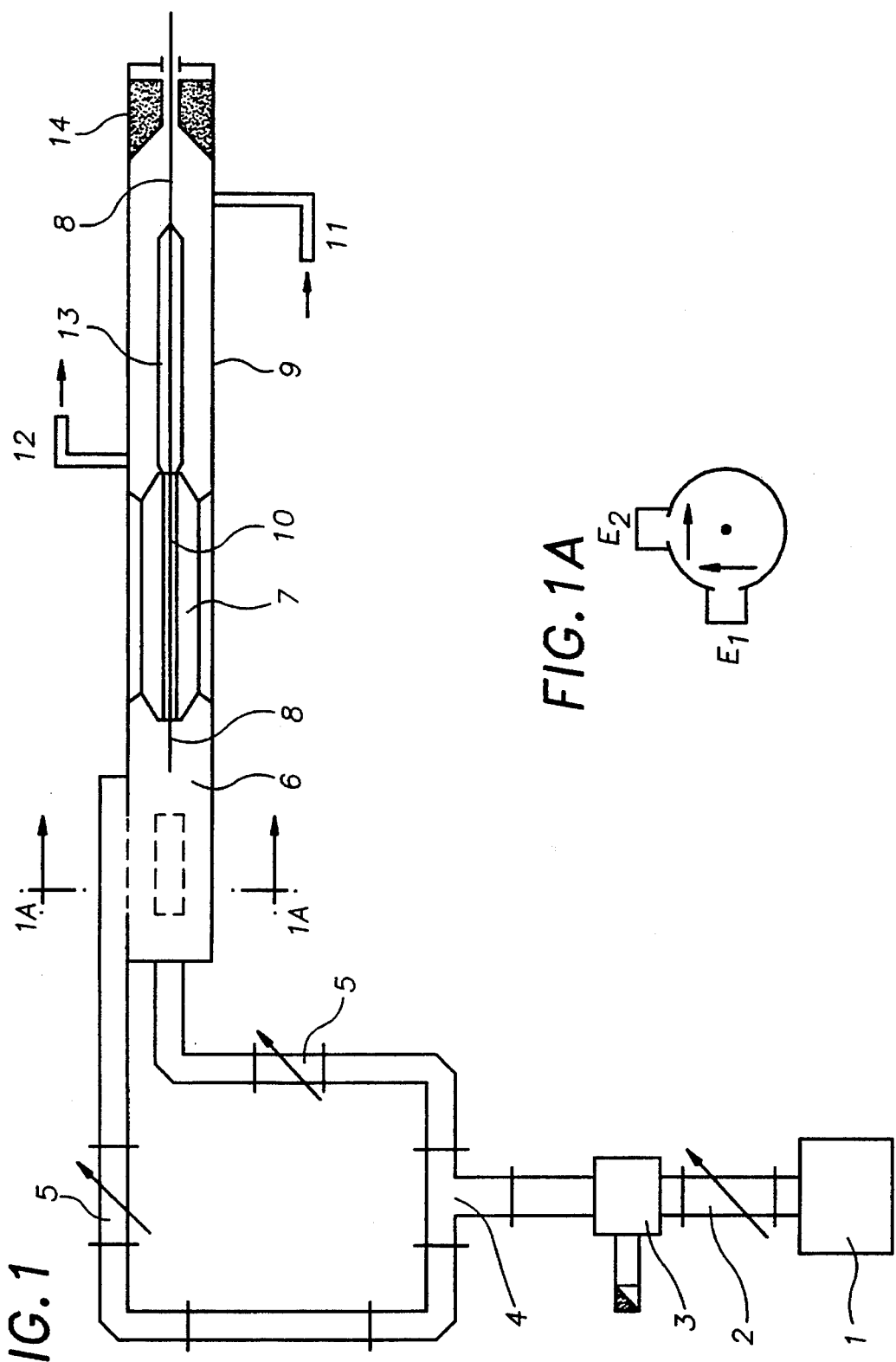
FIG. 1 shows a typical device used to generate surface plasma waves on a filament.

A preferred embodiment of the device used to generate surface plasma waves is shown in FIG. 1 Microwave energy from a generator 1 is passing through circulator 3, splitter 4, two rotators 5 into two inputs of plasmatron 6. A delay line shifts one part of the microwave by $\lambda/4$ (phase shift is equal to $\pi/2$). Therefore two parts of the microwave after appropriate combination in plasmatron 6 can generate a circular field. Cross section of the plasmatron performing such a combination is shown in FIG. 1. This circular field being coupled to dielectric filament 8 through a suitably shaped quartz road 7 generates a hybrid rotating surface wave of the $HE_{11}$- type on the surface of filament 8 passing through deposition chamber 9. Quartz road 7 has hole 10 through which filament 9 passes. Fresh reactant gas is fed into the reaction chamber through inlet 11 and used gas is exhausted through outlet 12. The plasma region 13 is formed only in the dose vicinity of filament 8 and load 14 may be incorporated to absorber and destroy excess energy on the end of the plasma column. This load could be a water jacket.

Feed gas may typically consist of Helium and $CH_4$ (or other rare gas/carbohydrate mixture) if the deposition of the diamondlike carbon coatings is desired. Pressure can typically be 0.5 to 5 Torr, but lower or higher pressures may be suitable for certain coatings.

EXAMPLE 1

A quartz glass filament of 5 mm diameter was coated with diamondlike carbon. The energy of the generator was 180 Watts, the frequency was 7 GHz, the pressure of the gas mixture (H700 cm³/min, $C_2H_2$ 70 cm³/min) was 1.2 Torr. A deposition rate of 10 µm/min was observes in the 5 cm long plasma column.

EXAMPLE 2

A quartz glass fiber of 280 µm diameter is to be coated. I in this case a frequency of 200 GHz with 20 Watts was used. The length of generated plasma region was 10 cm, deposition speed was estimated as 5 µm/min out of 1:10 $C_2H_2/H$ feed gas.

It will be possible to generate the rotating E-field by alternative means as the one described above (for instance, 2 synchronized generators may be used instead of one and a splitter) and we therefore refer to this subsystem as a microwave generator arrangement. Equally it is possible to find alternative form of the launching arrangement (described above as a quartz body) to generate the $HE_{11}$ surface wave on the surface of the filament. One can for instance employ an adiabatically long taper to optimally match generated microwave to small cross section of the fiber.

The deposition chamber is suitably chosen much longer than the filament dimension, and has a diameter typically exceeding 20 mm. It is thus assured that no deposition can occur on the chamber walls and a steady clean gas supply can easily be achieved.

Figure 2:
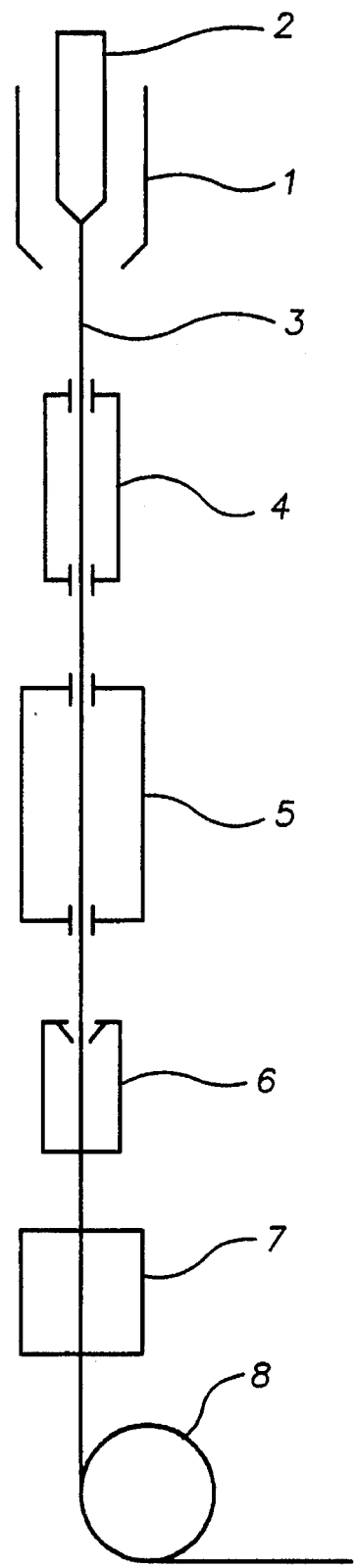
FIG. 2 shows a schematic view of an optical fiber draw process incorporating such a coating step.

The coating apparatus described can conveniently be incorporated in an optical fiber drawing process as it is schematically shown in FIG. 2. Fiber 3 drawed from preform 2 heated in furnace 1 after cleaning (optional) in plasma cleaning arrangement 4 passes through deposition chamber 5. The dielectric layers deposit on the surface of the fiber can then be protected with extra polymer coating (optional) as the fiber passes through pressurized polymer coating cap 6 and UV curing unit 7.

Having described preferred embodiments of the invention with reference to the accompanying drawings, it is to be understood that the invention is not limited to the precise embodiments, and that various changes and modifications may be effected therein by skilled in the art without departing from the scope or spirit of the invention as defined in the appended claims.

What is claimed is:

1. A method for coating dielectric filaments by a plasma enhanced CVD deposition process with a dielectric layer, using a microwave generated plasma, comprising the steps of:

a. introducing a dielectric filament with an outer surface to be coated into a deposition chamber;

b. supplying said deposition chamber with a reactive gas containing a coating material precursor;

c. generating a plasma in said deposition chamber as a surface plasma wave on said dielectric filament's surface with said surface plasma generated as a hybrid azimuthal $HE_{11}$ wave, excited on said dielectric filament and wherein a microwave generator uses a microwave whose wavelength, $\lambda$, is no greater than $$\lambda_{crit}=1.3d(\epsilon_1-\epsilon_2)^{1/2},$$

in which d is said dielectric filament's diameter, $\epsilon_1$ is said filament's dielectric constant and $\epsilon_2$ is said plasma's dielectric constant; and d. having said reactive gas react with said surface plasma wave depositing at least one layer of a desired coating onto said dielectric filament.

2. A coating process according to claim 1, wherein said dielectric filament is an optical fiber and said optical fiber travels through said deposition chamber so as to make said coating process a continuous process.

3. An apparatus for the coating of dielectric filaments with dielectric layers by a plasma CVD process comprising:

a. a deposition chamber having a means for introducing a dielectric filament into a plasma generated within said chamber;

b. a microwave generator system having a means of generating a rotating E-field, connected to said deposition chamber;

c. a surface plasma wave generated by said microwave generator on a dielectric filament's outer surface, and being characterized as a hybrid azimuthal $HE_{11}$ wave; and d said surface plasma wave has a wavelength, $\lambda$, no greater than $$\lambda_{crit}=1.3d(\epsilon_1-\epsilon_2)^{1/2},$$

in which d is said dielectric filament's diameter, $\epsilon_1$ is said filament's dielectric constant and $\epsilon_2$ is said plasma's dielectric constant.

4. A coating apparatus according to claim 3, wherein said microwave generator system includes a splitter to split said microwave into two orthogonal, linearly polarized components, a phase delay of $\lambda/4$ for one component and a combiner such that said microwave generator generates said rotating E-field; and wherein said means of introducing a dielectric filament consists essentially of a dielectric double cone or a taper having a central hole to allow said filament to pass through said double cone or taper concentric to said filament's axis.

5. A coating apparatus according to claim 3 wherein said microwave generator system also includes two synchronized generators generating a superposition of two orthogonal linear polarized waves with a phase shift equal to $\pi/2$ which generates said rotating E-field on said dielectric filament.

* * * * *